(12) United States Patent
Obu et al.

(10) Patent No.: US 9,679,860 B2
(45) Date of Patent: Jun. 13, 2017

(54) BUMP-EQUIPPED ELECTRONIC COMPONENT AND METHOD FOR MANUFACTURING BUMP-EQUIPPED ELECTRONIC COMPONENT

(71) Applicant: Murata Manufacturing Co., Ltd., Nagaokakyo-shi, Kyoto-fu (JP)

(72) Inventors: Isao Obu, Nagaokakyo (JP); Shinya Osakabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/070,094

(22) Filed: Mar. 15, 2016

(65) Prior Publication Data
US 2016/0197052 A1    Jul. 7, 2016

Related U.S. Application Data

(62) Division of application No. 14/096,044, filed on Dec. 4, 2013, now Pat. No. 9,343,360.

(30) Foreign Application Priority Data

Dec. 5, 2012  (JP) ................................. 2012-266547
Oct. 8, 2013  (JP) ................................. 2013-211181

(51) Int. Cl.
*H01L 23/538* (2006.01)
*H01L 23/00* (2006.01)
*H01L 21/768* (2006.01)
*H01L 23/13* (2006.01)
(Continued)

(52) U.S. Cl.
CPC ........ *H01L 24/14* (2013.01); *H01L 21/76885* (2013.01); *H01L 23/13* (2013.01); *H01L 23/49822* (2013.01); *H01L 23/5386* (2013.01); *H01L 24/11* (2013.01); *H03H 9/059* (2013.01); *H03H 9/0514* (2013.01);
(Continued)

(58) Field of Classification Search
CPC ... H01L 24/14; H01L 23/5386; H01L 23/538; H01L 23/13; H01L 24/10; H01L 24/11; H01L 24/12; H01L 24/13
See application file for complete search history.

(56) References Cited

U.S. PATENT DOCUMENTS 5,869,903 A * 2/1999 Nakatani ............. H01L 23/4985
                                                         257/275
6,232,668 B1 * 5/2001 Hikita ............... H01L 23/49575
                                                         257/659
(Continued)

OTHER PUBLICATIONS

Obu et al., "Bump-Equipped Electronic Component and Method for Manufacturing Bump-Equipped Electronic Components", U.S. Appl. No. 14/096,044, filed Dec. 4, 2013.

*Primary Examiner* — Michele Fan
(74) *Attorney, Agent, or Firm* — Keating & Bennett, LLP

(57) ABSTRACT

A bump-equipped electronic component includes a circuit substrate and first and second bumps which are disposed on a principal surface of the circuit substrate and have different cross-sectional areas in a direction parallel or substantially parallel to the principal surface. One of the first and second bumps having a smaller cross-sectional area includes a height adjustment layer disposed in a direction perpendicular or substantially perpendicular to the principal surface.

4 Claims, 8 Drawing Sheets

(51) Int. Cl.
*H01L 23/498* (2006.01)
*H03H 9/05* (2006.01)

(52) U.S. Cl.
CPC ............ *H01L 2224/16225* (2013.01); *H01L 2924/12042* (2013.01); *H01L 2924/351* (2013.01)

(56) References Cited

U.S. PATENT DOCUMENTS

| | | | | |
|---|---|---|---|---|
| 6,443,351 | B1* | 9/2002 | Huang | B23K 3/0623 228/103 |
| 6,870,270 | B2* | 3/2005 | Kobrinsky | H01L 24/13 257/777 |
| 7,045,900 | B2* | 5/2006 | Hikita | H01L 23/49575 257/777 |
| 8,970,035 | B2* | 3/2015 | Lin | H01L 24/06 257/737 |
| 9,318,426 | B2* | 4/2016 | Tani | H01L 23/49811 |
| 2002/0151228 | A1* | 10/2002 | Kweon | H01L 23/49816 439/887 |
| 2005/0110161 | A1* | 5/2005 | Naito | H01L 24/81 257/778 |
| 2007/0007665 | A1* | 1/2007 | Clevenger | H01L 23/13 257/780 |
| 2009/0127705 | A1* | 5/2009 | Miyata | H01L 22/34 257/737 |

* cited by examiner

US 9,679,860 B2

BUMP-EQUIPPED ELECTRONIC COMPONENT AND METHOD FOR MANUFACTURING BUMP-EQUIPPED ELECTRONIC COMPONENT

BACKGROUND OF THE INVENTION

1. Field of the Invention

The present invention relates to a bump-equipped electronic component and a method for manufacturing a bump-equipped electronic component.

2. Description of the Related Art

There are known bump-equipped electronic components, for example, a bump-equipped semiconductor substrate which has a plurality of bumps having different cross-sectional areas in a direction parallel to the principal surface of the semiconductor substrate (refer to Japanese Unexamined Patent Application Publication No. 2001-223321).

In the case where bumps having different cross-sectional areas, in a direction parallel to the principal surface of a semiconductor substrate, are formed of plating films, since the plating film growth rate differs between the bumps having different cross-sectional areas, the resulting bumps have different heights from the principal surface of the substrate. Specifically, the plating film growth rate increases as the cross-sectional area (diameter) of the bump increases. Therefore, the bump height from the principal surface of the substrate increases with increasing cross-sectional area of the bump.

When such a semiconductor substrate provided with bumps having different heights is mounted on a mounting substrate, the semiconductor substrate becomes inclined relative to the mounting substrate. Consequently, an unwanted capacitance is generated between the circuit on the semiconductor substrate and the mounting substrate, resulting in changes in the characteristics of the semiconductor chip.

Furthermore, in the case where the semiconductor substrate is mounted in an inclined manner, stress is concentrated in the connecting portion of the semiconductor substrate at the bump having a small cross-sectional area, i.e., the connecting portion of the semiconductor substrate at the bump having a small height from the principal surface, resulting in failure of a connection between the semiconductor substrate and the mounting substrate.

SUMMARY OF THE INVENTION

Accordingly, preferred embodiments of the present invention prevent changes in characteristics of semiconductor chips and failure of a connection between a semiconductor substrate and a mounting substrate.

According to a preferred embodiment of the present invention, a bump-equipped electronic component includes a circuit substrate and first and second bumps which are disposed on a principal surface of the circuit substrate and include different cross-sectional areas in a direction parallel or substantially parallel to the principal surface, in which one of the first and second bumps having a smaller cross-sectional area includes a height adjustment layer disposed in a direction perpendicular or substantially perpendicular to the principal surface.

Furthermore, according to a preferred embodiment of the present invention, a method for manufacturing a bump-equipped electronic component includes a step of forming first and second bumps on a principal surface of a circuit substrate, the first and second bumps having different cross-sectional areas in a direction parallel or substantially parallel to the principal surface, in which the step of forming the bumps includes a step of forming a height adjustment layer in a direction perpendicular or substantially perpendicular to the principal surface when one of the first and second bumps having a smaller cross-sectional area is formed.

According to various preferred embodiments of the present invention, it is possible to prevent changes in characteristics of semiconductor chips and failure of a connection between a semiconductor substrate and a mounting substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
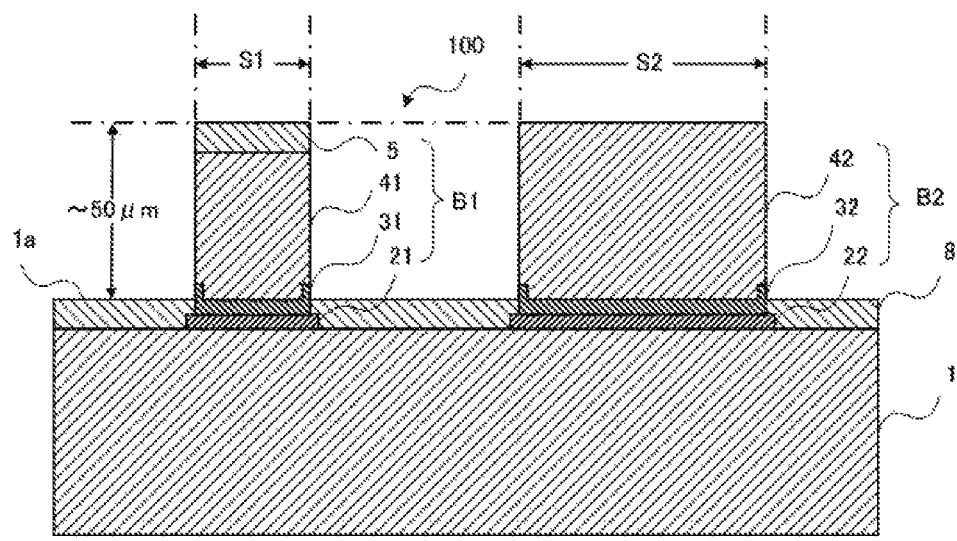
FIG. 1 is a cross-sectional view of a bump-equipped electronic component according to a first preferred embodiment of the present invention.

FIG. 1 is a cross-sectional view of a bump-equipped electronic component (hereinafter referred to as the "electronic component"), such as a semiconductor chip, according to a first preferred embodiment of the present invention.

A circuit substrate 1 of an electronic component 100 is a semiconductor substrate or a piezoelectric substrate includes in a surface acoustic wave (SAW) filter or the like. Examples of the semiconductor substrate include a GaAs substrate and a Si substrate, and examples of the piezoelectric substrate include a $LiTaO_3$ substrate and a $LiNbO_3$ substrate. A semiconductor circuit (not shown) is provided on a principal surface 1a of the circuit substrate 1.

Cylindrical bumps B1 and B2 having different cross-sectional areas in a direction parallel or substantially parallel to the principal surface 1a (hereinafter referred to as the "cross-sectional areas") are provided on the circuit substrate 1. A cross-sectional area S1 of the bump B1 is smaller than a cross-sectional area S2 of the bump B2. The height of each of the bumps B1 and B2 from the principal surface 1a preferably is about 50 μm, for example. The bumps B1 and B2 preferably are mainly composed of Cu, and Au can also be used in addition to Cu. The bumps B1 and B2 are preferably formed, for example, by electrolytic plating. A protective film 8 (e.g., $SiN_x$; thickness: about 0.5 μm) is located in a region on the circuit substrate 1 other than regions in which the bumps B1 and B2 are located. The shape of each of the bumps B1 and B2 is not limited to the cylindrical shape, but may be a rectangular columnar shape or the like.

The bump B1 includes an Au pad 21, a metal layer 31, a Cu pillar 41, and a height adjustment layer 5, and the Au pad 21, the metal layer 31, the Cu pillar 41, and the height adjustment layer 5 are stacked in that order on the circuit substrate 1. The bump B2 includes an Au pad 22, a metal layer 32, and a Cu pillar 42, and the Au pad 22, the metal layer 32, and the Cu pillar 42 are stacked in that order on the circuit substrate 1.

The Au pads 21 and 22 are located on the circuit substrate 1 and used as input/output electrodes for electric signals. The metal layers 31 and 32 preferably are seed electrode layers for plating, for example, composed of Ti (thickness: about 0.1 μm) and Cu (thickness: about 0.1 μm). The Cu pillars 41 and 42 preferably are layers formed by electrolytic plating. The height adjustment layer 5 is an electrode layer preferably composed of Cu to adjust the height of the bump B1 on the principal surface 1a to be the same as the height of the bump B2, and is formed, for example, by an ink-jet method, which will be described later. The height adjustment layer 5 and the bump B1 have the same cross-sectional area S1.

In the electronic component 100 having the configuration described above, even when two bumps B1 and B2 having different cross-sectional areas are present, the height from the principal surface 1a of the circuit substrate 1, i.e., the height of the electronic component 100, can be made uniform. Consequently, when the electronic component 100 is mounted on the principal surface of a mounting substrate with the bumps B1 and B2 therebetween, the inclination of the electronic component 100 can be eliminated, and it is possible to prevent occurrence of failure of a connection between the electronic component 100 and the mounting substrate (unconnected bumps). This can improve the mounting yield of the electronic component 100. Furthermore, since the electronic component 100 is not mounted on the mounting substrate in an inclined manner, an unwanted capacitance is not generated between the semiconductor circuit of the electronic component 100 and the mounting substrate, and it is possible to prevent changes in the characteristics of the semiconductor circuit.

In the preferred embodiment described above, the height adjustment layer 5 is preferably composed of the same material as the main material (Cu) constituting the bump B1. However, the height adjustment layer 5 may be composed of a different material, for example. For example, as the material of the height adjustment layer 5, gold, silver, aluminum, platinum, tantalum, titanium, or the like can be used. When gold, silver, or aluminum is used, since it preferably has substantially the same mechanical characteristics as those of copper which is the main material, thermal stress due to heating at the time of mounting bumps and mechanical stress at the time of pressure application is relaxed. Furthermore, when platinum, tantalum, or titanium is used, solderability at the time of mounting bumps can be improved.

Furthermore, since the height adjustment layer 5 is disposed on the top end of the bump B1, the height of the bump B1 in a direction perpendicular or substantially perpendicular to the principal surface 1a can be easily adjusted.

Furthermore, the height adjustment layer 5 and the bump B1 have the same cross-sectional area S1. Consequently, since the bump B1 does not expand in a direction parallel or substantially parallel to the principal surface 1a of the circuit substrate 1, the mounting area of the electronic component 100 is decreased.

Furthermore, the height adjustment layer 5 may have a resistivity that is different from the resistivity of a main material (Cu) constituting the bump B1 provided with the height adjustment layer 5. In the case where a metal material different from the main material constituting the bump B1, for example, a metal material having a high resistance, is used as the material for the height adjustment layer 5, a resistor is defined using the bump B1. Accordingly, the bump B1 is used as a circuit in the electronic component 100, and the design freedom of the electronic component 100 is improved.

Second Preferred Embodiment

A second preferred embodiment of the present invention will now be described. The second preferred embodiment differs from the first preferred embodiment in that the height adjustment layer 5 is disposed in the middle of the bump B1, i.e., a barrier metal layer and a solder layer are further stacked on the height adjustment layer 5. The same element as that of the first preferred embodiment is denoted with the same reference sign, and detailed description thereof will be omitted.

Figure 2:
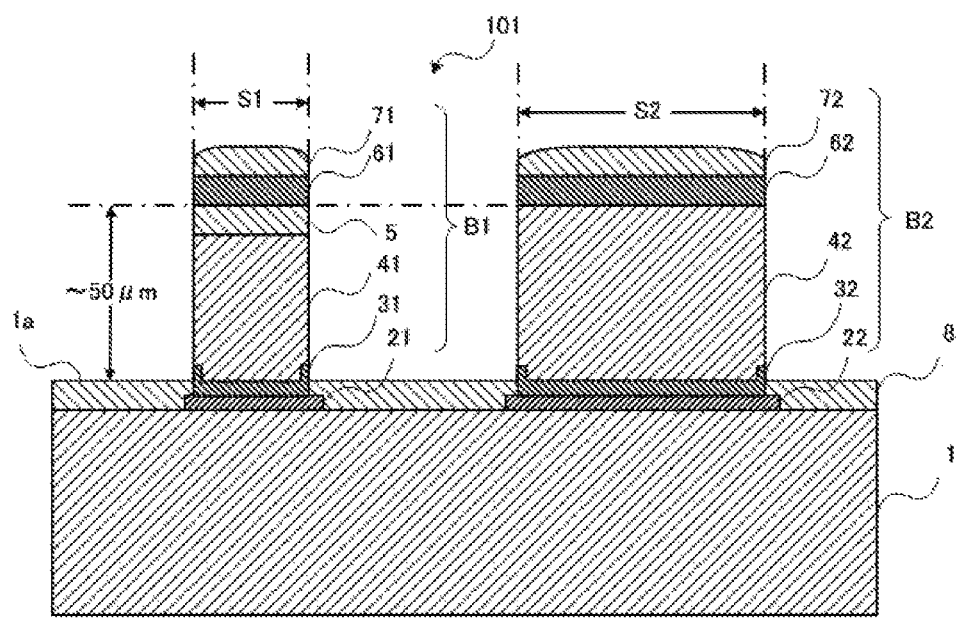
FIG. 2 is a cross-sectional view of a bump-equipped electronic component according to a second preferred embodiment of the present invention.

As shown in FIG. 2, in a bump B1 of an electronic component 101, a barrier metal layer 61 and a solder layer 71 are stacked in that order on a height adjustment layer 5. In a bump B2, a barrier metal layer 62 and a solder layer 72 are stacked in that order on a Cu pillar 42. The barrier metal layer 61 and the solder layer 71 each have a cross-sectional area S1, and the barrier metal layer 62 and the solder layer 72 each have a cross-sectional area S2.

The barrier metal layers 61 and 62 preferably are each composed of, for example, Ni (thickness: about 0.5 μm). The solder layers 71 and 72 are each preferably composed of, for example, an Ag—Sn-based solder.

In the electronic component 101 according to the second preferred embodiment, since the height adjustment layer 5 is disposed in the middle of the bump B1 (not as a top end layer or a layer on the side of the principal surface of the substrate), the same metal material (solder: Ag—Sn, in the second preferred embodiment) as that of the other bump B2 can be disposed on the top end of the bump B1, and electrical characteristics and electrical connection reliability are equalized between the bumps B1 and B2.

Furthermore, as the material for the height adjustment layer 5, a material for forming an insulating film, such as $SiN_x$ or $SiO_2$, may be used. In such a case, the Cu pillar 41-height adjustment layer 5-barrier metal layer 61 (metal-insulator-metal) defines a metal-insulation-metal (MIM) capacitor, and a capacitor can be provided in the electronic component 101. Furthermore, in the case where the bump B1 is mounted on a separately prepared mounting substrate or the like, the bump B1 functions as a terminal electrode. A MIM capacitor can be formed in the terminal electrode, and it is possible to configure such that radio-frequency signals only are transmitted and direct-current signals, such as signals from a power source and control signals, are blocked.

Third Preferred Embodiment

A third preferred embodiment will now be described with reference to FIG. 2. The third preferred embodiment differs from the second preferred embodiment in that the solder layers 71 and 72 are preferably made of different materials depending on the cross-sectional area of the bump. The same element as that of the second preferred embodiment is denoted with the same reference sign, and detailed description thereof will be omitted.

Sn—Bi is preferably used as the material for the solder layer 71 shown in FIG. 2, and Ag—Sn is preferably used as the material for the solder layer 72. In other words, in the bump B1 having a smaller cross-sectional area, a Sn—Bi-based solder that has a lower melting point than an Ag—Sn-based solder is preferably used, and in the bump B2 having a larger cross-sectional area, an Ag—Sn-based solder that has a higher melting point is preferably used.

In the electronic component 101 according to the third preferred embodiment, when the solder layers 71 and 72 of the bumps B1 and B2 are melted and then hardened in the reflow soldering process or the like (for example, when the electronic component 101 is mounted on a mounting substrate), the solder layer 72 of the bump B2 having a larger cross-sectional area is hardened first at a higher temperature, and subsequently, the solder layer 71 of the bump B1 having a smaller cross-sectional area is hardened at a lower temperature. When a solder layer is hardened, contraction stress occurs because the solvent and the like contained in the solder layer evaporate. As the cross-sectional area of a bump increases, the contraction stress thereof increases. Therefore, by hardening the bump B2 having a larger cross-sectional area first, the contraction stress applied to the bump B1 having a smaller cross-sectional area during being hardened is reduced, and thus connection reliability of the bumps B1 and B2 to the mounting substrate is improved.

An example of a method for manufacturing the electronic component 100 according to the first preferred embodiment will be described in detail with reference to FIG. 3.

Figure 3:
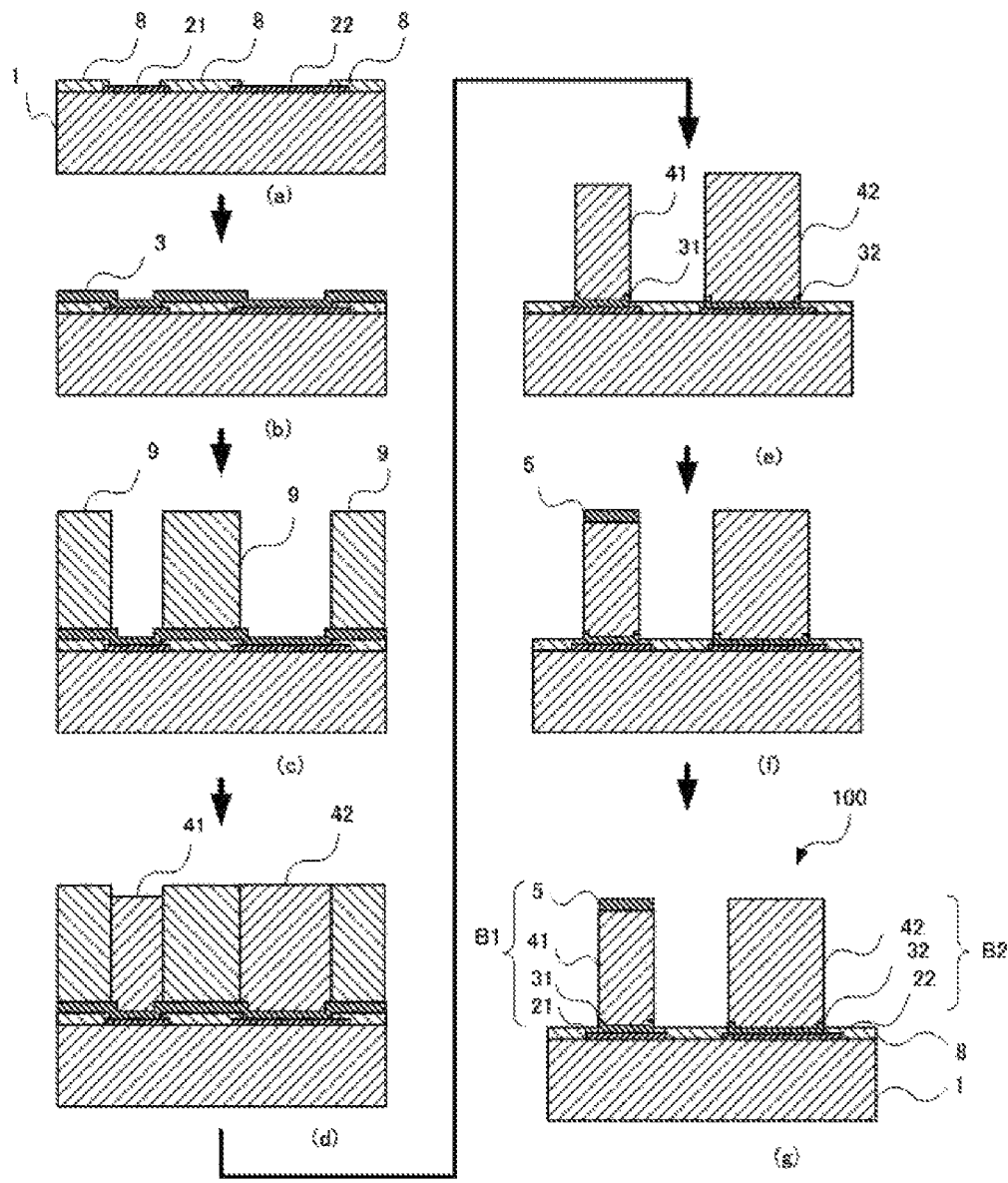
FIG. 3 is a diagram illustrating steps for manufacturing a bump-equipped electronic component according to the first preferred embodiment of the present invention.

First, a semiconductor circuit (not shown) is formed on a circuit substrate 1 by a normal semiconductor process, and then, openings are formed by a lithographic technique or the like in a $SiN_x$ protective film 8 to expose Au pads (electric signal input/output pads) 21 and 22 (step (a) in FIG. 3).

Next, Ti (thickness: 0.1 μm) and Cu (thickness: 0.1 μm) for forming seed electrodes for plating are deposited in that order, for example, by sputtering over the entire surface of the semiconductor circuit (step (b) in FIG. 3). As a result, a metal layer 3 is formed.

Next, a photoresist 9 is applied by coating onto the metal layer 3, and exposure and development are performed using a photomask. As a result, openings are formed at regions where Cu pillars 41 and 42 are to be formed (step (c) in FIG. 3).

Next, Cu is deposited by electrolytic plating in the photoresist openings to form Cu pillars 41 and 42 (step (d) in FIG. 3). In this step, since the electrolytic plating growth rate differs depending on the cross-sectional area, the Cu pillar 41 with the cross-sectional area S1 and the Cu pillar 42 with the cross-sectional area S2 (>S1) have different heights. As shown in FIG. 3, the height of the Cu pillar 42 from the principal surface 1a of the circuit substrate 1 is larger than the height of the Cu pillar 41.

Next, the photoresist is removed, and the seed electrodes for plating other than the Cu pillars 41 and 42 are removed by etching (step (e) in FIG. 3).

Next, a conductive paste containing Cu for adjustment is deposited by an ink-jet method on the desired Cu pillar only. In this manufacturing method, the Cu material is deposited on the Cu pillar 41 of the bump B1 (step (f) in FIG. 3).

Next, the Cu material deposited by the ink-jet method is solidified by heat treatment (step (g) in FIG. 3). As a result, the height adjustment layer 5 is formed on the bump B1.

An electronic component 100 according to the first preferred embodiment can be fabricated through the steps (a) to (g) shown in FIG. 3. Furthermore, the height adjustment layer 5 can be formed using a photolithographic technique, thick film printing, or the like, instead of the ink-jet method. However, in the ink-jet method, since a conductive paste in the form of liquid drops is used, the height adjustment layer 5 can be formed with high accuracy.

An example of a method for manufacturing the electronic component 101 according to the second preferred embodiment will be described in detail with reference to FIG. 4. Since steps (a) to (g) are preferably the same as the steps (a) to (g) described with reference to FIG. 3, the drawing and description thereof will be omitted. Steps (h) to (k) subsequent to the step (g) will be described in detail.

Figure 4:
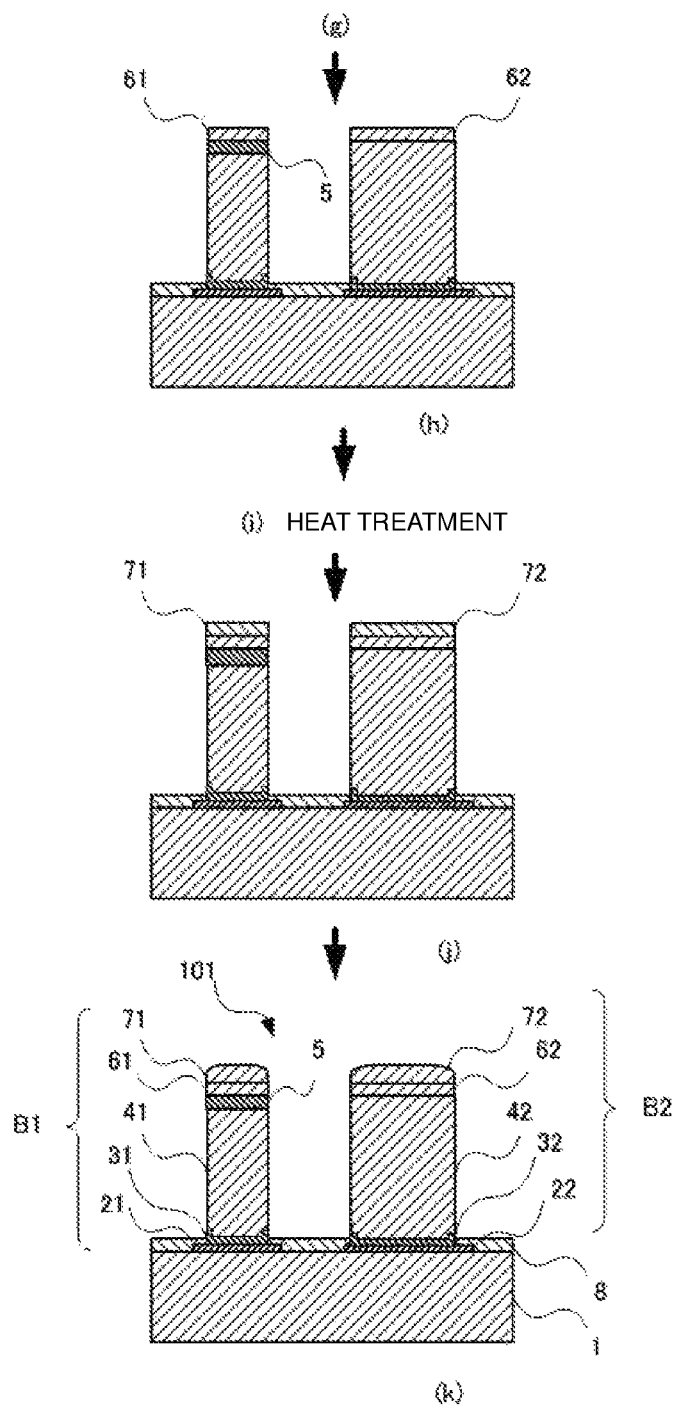
FIG. 4 is a diagram illustrating steps for manufacturing a bump-equipped electronic component according to the second preferred embodiment of the present invention.

After undergoing the heat hardening step (step (g) in FIG. 3), a barrier metal material (e.g., conductive paste containing Ni) is deposited by an ink-jet method on the Cu pillars 41 and 42 (step (h) in FIG. 4), and the deposited Ni material is solidified by heat treatment (step (i) in FIG. 4). As a result, barrier metal layers 61 and 62 are formed on the height adjustment layer 5 of the bump B1 and the Cu pillar 42 of the bump B2, respectively.

Next, a solder material (e.g., Ag—Sn) is deposited by an ink-jet method on the barrier metal layers 61 and 62 (step (j) in FIG. 4), and the deposited solder material is solidified by heat treatment (step (k) in FIG. 4). As a result, solder layers 71 and 72 are deposited on the barrier metal layers 61 and 62, respectively.

An electronic component 101 according to the second preferred embodiment can be fabricated through the steps (a) to (g) shown in FIG. 3 and the steps (h) to (k) shown in FIG. 4. Note that an electronic component 101 according to the third preferred embodiment can be fabricated by depositing different solder materials on the barrier metal layers 61 and 62.

In the first to third preferred embodiments, description has been made of the case where the bumps B1 and B2 are located on the principal surface 1a of the circuit substrate 1. However, the present invention is not limited thereto. For example, the electronic component 100 or 101 of preferred embodiments of the present invention may be configured such that three or more bumps having different cross-sectional areas in a direction parallel or substantially parallel to the principal surface 1a of the substrate are provided, and a height adjustment layer 5 is disposed on at least one of the bumps.

Furthermore, in the first to third preferred embodiments, description has been made of the case where the height of the bump B1 from the principal surface 1a is adjusted by the height adjustment layer 5 to the same height as the height of the bump B2 from the principal surface 1a. However, the present invention is not limited thereto. For example, a configuration may be used in which each of bumps B1 and B2 includes a height adjustment layer 5 which adjusts the height from the principal surface 1a to a predetermined height.

The step of forming the height adjustment layer 5 (step (f) in FIG. 3), which is one of the steps described with reference to FIG. 3, will be described in detail.

Figure 5:
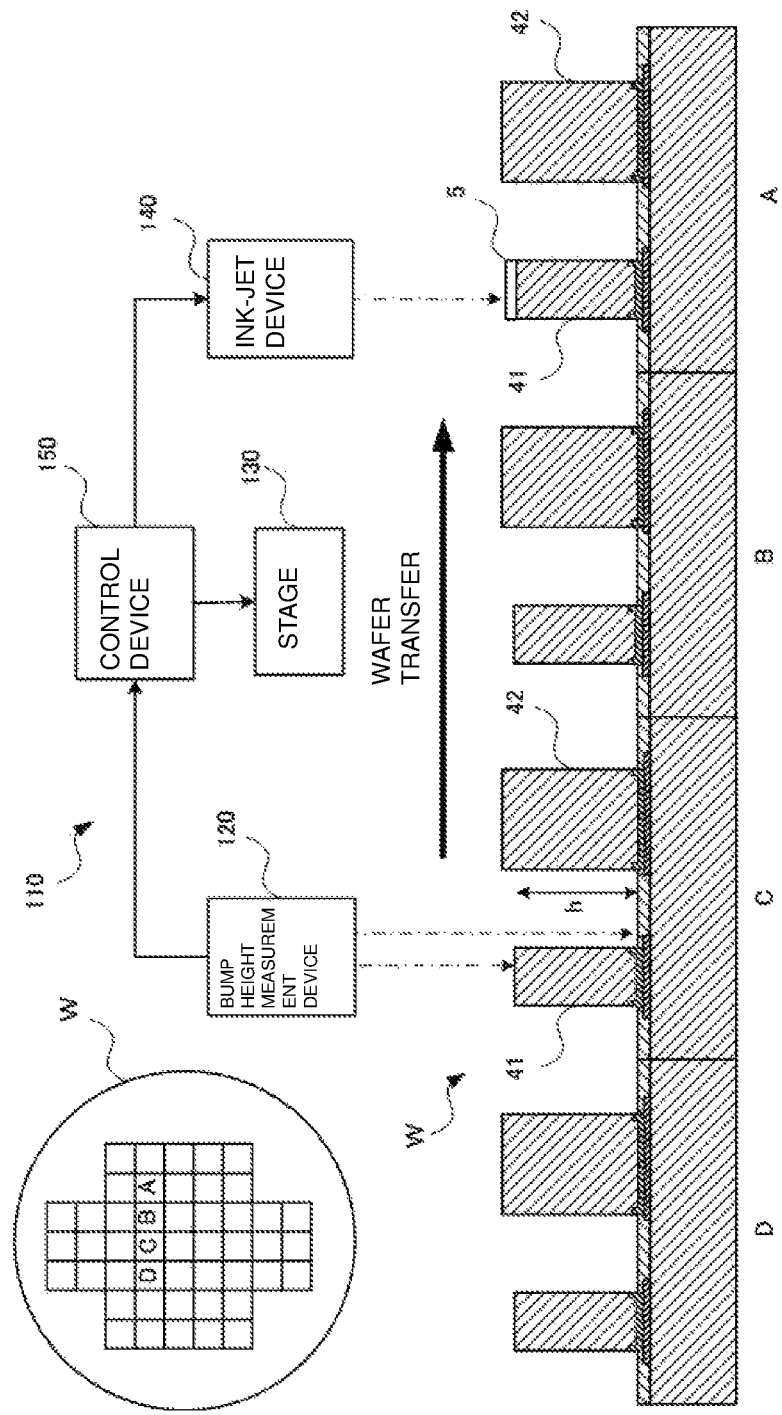
FIG. 5 is a diagram illustrating one of the steps for manufacturing a bump-equipped electronic component according to the first and second preferred embodiments of the present invention.

FIG. 5 is a diagram illustrating the step of forming the height adjustment layer 5. As shown in FIG. 5, an ink-jet system 110 used to form the height adjustment layer 5 includes a bump height measurement device 120 which measures the height of the bump B1 and the like of the electronic component 100, a stage 130 which transfers a wafer W, an ink-jet device 140 which forms the height adjustment layer 5 by an ink-jet method using a conductive paste, and a control device 150 which controls the bump height measurement device 120, the stage 130, and the ink-jet device 140. Furthermore, the wafer W includes a plurality of electronic components 100 (hereinafter, also referred to as "electronic components A, B, C, and D").

First, the stage 130 transfers the wafer W, on the basis of the control of the control device 150, to a predetermined position. For example, a method may be used in which an image of the wafer W is taken by a camera or the like in advance, the position of the Cu pillar 41 is detected by processing the resulting image, and the wafer W is transferred on the basis of the detection results. Alternatively, a method may be used in which information, such as the position of the Cu pillar 41 in the wafer W, is stored in a predetermined memory of the control device 150 in advance, and the wafer W is transferred on the basis of the information stored in the memory.

When the wafer W is transferred and the Cu pillar 41 is located perpendicularly or substantially perpendicularly below the bump height measurement device 120, the bump height measurement device 120 measures the height of the Cu pillar 41 from the principal surface 1a, using a laser or the like, and sends control information showing the measured height of the pillar 41 and the position (coordinates in the wafer W) of the Cu pillar 41 to the control device 150. The bump height measurement device 120 carries out such a process each time when the Cu pillar 41 of each electronic component 100 is located perpendicularly or substantially perpendicularly below the bump height measurement device 120.

Next, the wafer W is transferred by the stage 130. When the Cu pillar 41 subjected to the bump height measurement is located perpendicularly or substantially perpendicularly below the ink-jet device 140, the control device 150 adjusts the ink jetting amount, on the basis of the height of the Cu pillar 41 from the principal surface 1a included in the control information, such that the height of the Cu pillar 41 (bump B1) becomes equal to the height of the Cu pillar 42 (bump B2), and the ink-jet device 140 ejects the Cu material onto the Cu pillar 41. In this case, the ink jetting amount may be set in advance, or an amount corresponding to the difference between the height of the Cu pillar 42 and the height of the Cu pillar 41 is calculated, and the calculated amount may be considered as a jetting amount. In such a manner, the Cu material is deposited on the Cu pillar 41 and then subjected to heat treatment to form the height adjustment layer 5.

In the step of forming the height adjustment layer 5, even when there are a plurality of Cu pillars 41, on each of which a height adjustment layer 5 is to be formed, height adjustment layers 5 can be formed on the Cu pillars 41 of all the electronic components A, B, C, D, and the like in the wafer by one process, and a complicated process is not needed.

In the case of an electronic component 100 configured to have three or more bumps having different cross-sectional areas in a direction parallel or substantially parallel to the principal surface 1a of the substrate, a height adjustment layer 5 may be formed on at least one of the Cu pillars of the bumps so as to achieve the same height as the height of the bump having the largest height from the principal surface 1a. Furthermore, in the case of an electronic component 100 in which a height adjustment layer is formed in each of bumps B1 and B2 so as to adjust the height from the principal surface 1a to a predetermined height, a height adjustment layer 5 may be formed on each of the bumps B1 and B2 so as to achieve the predetermined height. Even in these cases, height adjustment layers 5 can be formed on all of the intended Cu pillars (bumps) in the wafer W by one process, and a complicated process is not needed.

Fourth Preferred Embodiment

A fourth preferred embodiment will now be described. In the fourth preferred embodiment, description will be made on a power amplifier 200 in which an electronic component 100 according to a preferred embodiment of the present invention is flip-chip mounted.

Figure 6:
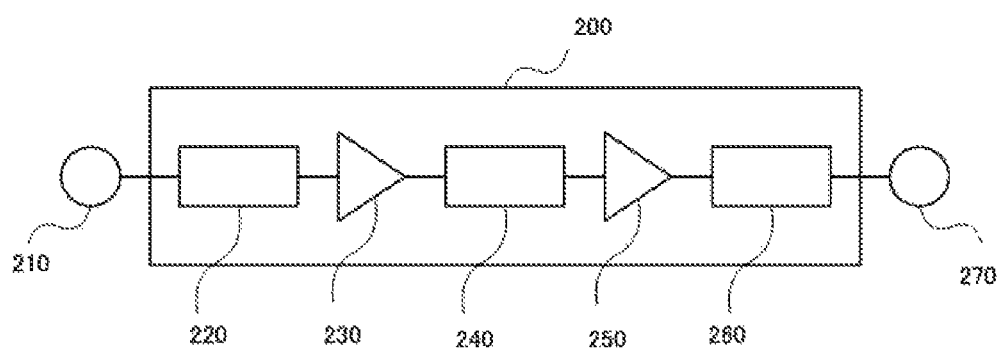
FIG. 6 is a block diagram of a power amplifier according to a fourth preferred embodiment of the present invention.

FIG. 6 is a block diagram of the power amplifier 200. As shown in FIG. 6, the power amplifier 200 includes a radio frequency input terminal 210 into which a radio-frequency signal is input, a first amplifier circuit 230 and a second amplifier circuit 250 which amplify the input signal from the radio frequency input terminal 210, and a radio frequency output terminal 270 from which the radio frequency signal is output. The power amplifier 200 also includes an input matching circuit 220 which matches impedance between the radio frequency input terminal 210 and the input terminal of the first amplifier circuit 230, an interstage matching circuit 240 which matches impedance between the output terminal of the first amplifier circuit 230 and the second amplifier circuit 250, and an output matching circuit 260 which matches impedance between the output terminal of the second amplifier circuit 250 and the radio frequency output terminal 270.

Figure 7:
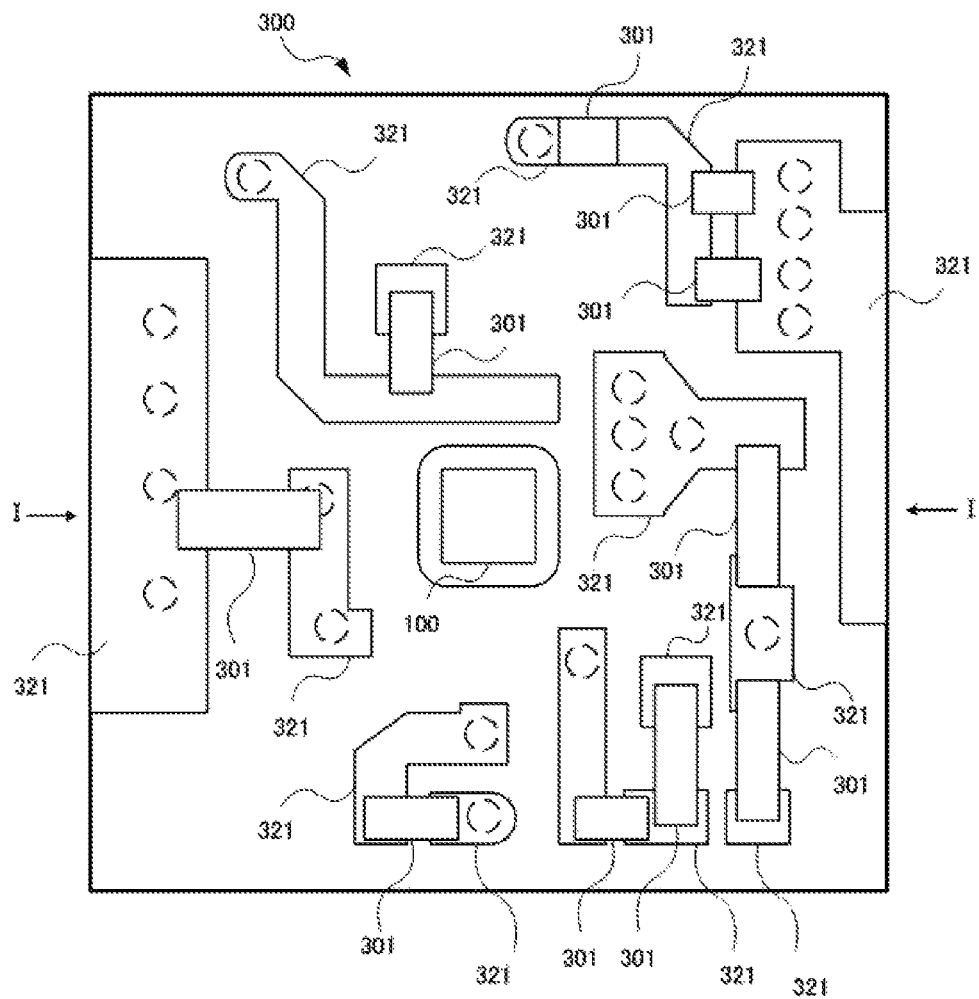
FIG. 7 is a plan view showing a mounted state of a power amplifier module constituting the power amplifier according to the fourth preferred embodiment of the present invention.
Figure 8:
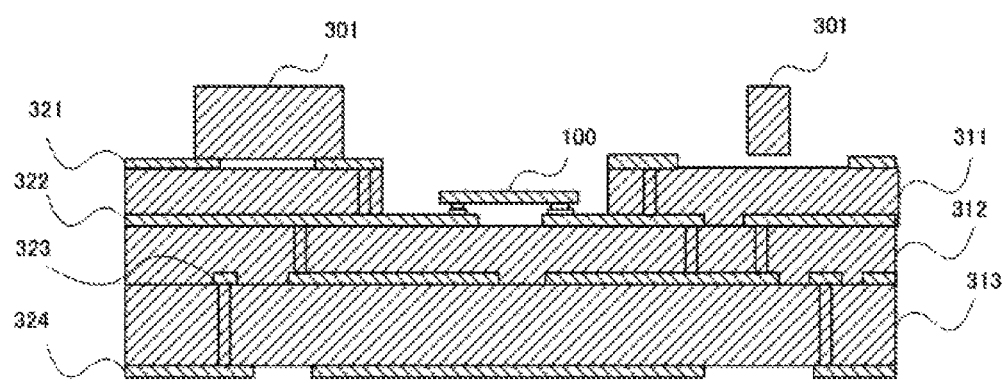
FIG. 8 is a cross-sectional view taken along I-I of FIG. 7.

FIG. 7 is a plan view showing a mounted state of a power amplifier module 300 constituting the power amplifier 200, and FIG. 8 is a cross-sectional view taken along I-I of FIG. 7.

As shown in FIG. 8, the power amplifier module 300 includes three insulating layers 311 to 313 and four conductor layers 321 to 324, which are alternately stacked, and an electronic component 100 is flip-chip mounted on the conductor layer 322. As shown in FIGS. 7 and 8, a plurality of passive elements 301 are disposed on a plurality of conductor layers 321 on the insulating layer 311 of the power amplifier module 300 so as to connect the conductor layers 321.

In the power amplifier module 300 according to the fourth preferred embodiment, since the electronic component 100 or 101, in which the bump B1 is adjusted by the height adjustment layer 5, is flip-chip mounted, when the electronic component 100 or 101 is connected to the conductor layer 322 of the mounting substrate, occurrence of failure of a connection (unconnected bumps) is prevented, and the production yield of the power amplifier is improved. Furthermore, it is possible to prevent changes in the characteristics of the semiconductor circuit of the electronic component 100. Furthermore, it is possible to adjust the mechanical characteristics and electrical characteristics of the electronic component 100 or 101.

The above described first to fourth preferred embodiments are intended to facilitate understanding of the present invention, and are not intended to limit the present invention. The present invention can be changed or improved without departing from the spirit thereof, and includes equivalents thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A bump-equipped electronic component comprising:
a circuit substrate; and first and second bumps primarily composed of Cu, disposed on a principal surface of the circuit substrate and having different cross-sectional areas in a direction parallel or substantially parallel to the principal surface of the substrate; wherein each of the first and second bumps includes seed layers, a pillar, an ink-jetted height adjustment layer, a barrier metal layer, and a solder layer stacked in that order on the principal surface of the circuit substrate; and the height adjustment layer adjusts a height from the principal surface of the substrate to a standard height.

2. The bump-equipped electronic component according to claim 1, wherein each of the height adjustment layers and the corresponding one of the first and second bumps have the same cross-sectional area in the direction parallel or substantially parallel to the principal surface.

3. The bump-equipped electronic component according to claim 1, wherein each of the height adjustment layers has a resistivity that is different from a resistivity of the Cu from which the respective one of the first and second bumps is primarily composed.

4. The bump-equipped electronic component according to claim 1, wherein the solder layer of one of the first and second bumps having a larger cross-sectional area in the direction parallel or substantially parallel to the principal surface has a higher melting point than that of the solder layer of the bump having a smaller cross-sectional area in direction parallel or substantially parallel to the principal surface.

* * * * *